(12) United States Patent
Mirkin et al.

(10) Patent No.: US 7,887,885 B2
(45) Date of Patent: Feb. 15, 2011

(54) NANOLITHOGRAPHY METHODS AND PRODUCTS THEREFOR AND PRODUCED THEREBY

(75) Inventors: Chad A. Mirkin, Wilmette, IL (US); Peter V. Schwartz, San Luis Obispo, CA (US); James J. Storhoff, Evanston, IL (US); So-Jung Park, Austin, TX (US)

(73) Assignee: Northwestern University, Evanston, IL (US)

( * ) Notice: Subject to any disclaimer, the term of this patent is extended or adjusted under 35 U.S.C. 154(b) by 1219 days.

(21) Appl. No.: 10/381,893

(22) PCT Filed: Oct. 19, 2001
(Under 37 CFR 1.47)

(86) PCT No.: PCT/US01/50958
§ 371 (c)(1),
(2), (4) Date: Feb. 2, 2004

(87) PCT Pub. No.: WO02/45215
PCT Pub. Date: Jun. 6, 2002

(65) Prior Publication Data
US 2004/0131843 A1 Jul. 8, 2004

Related U.S. Application Data

(60) Provisional application No. 60/243,168, filed on Oct. 20, 2000.

(51) Int. Cl.
*B05D 3/12* (2006.01)
(52) U.S. Cl. ........................ 427/259; 427/270; 427/271; 427/355; 977/856; 977/857; 977/863; 977/884; 977/885; 977/886

(58) Field of Classification Search ................. 427/256, 427/258, 259, 261, 264, 265, 270, 271, 272, 427/282, 277, 355, 356, 358, 301; 536/22.1, 536/25.3; 436/809; 435/258.4; 216/39; 977/849, 855, 856, 857, 863, 883, 885, 884, 977/886
See application file for complete search history.

(56) References Cited

U.S. PATENT DOCUMENTS 4,968,585 A * 11/1990 Albrecht et al. ............. 430/320

(Continued)

FOREIGN PATENT DOCUMENTS

WO WO 96/31625 10/1996

(Continued)

OTHER PUBLICATIONS

Liu et al., "Patterning Surfaces Using Tip-Directed Displacement and Self-Assembly," Langmuir 2000, 16, 3006-3009.*

(Continued)

*Primary Examiner*—William Phillip Fletcher, III
(74) *Attorney, Agent, or Firm*—Sheridan Ross, P.C.

(57) ABSTRACT

The invention provides methods of nanolithography and products therefor and produced thereby. In particular, the invention provides a nanolithographic method referred to as high force nanografting (HFN). HFN utilizes a tip (e.g., a scanning probe microscope (SPM) tip such as an atomic force microscope (AFM) tip) to pattern a substrate passivated with a resist. In the presence of a patterning compound, the tip is used to apply a high force to the substrate to remove molecules of the resist from the substrate, whereupon molecules of the patterning compound are able to attach to the substrate the form the desired pattern.

29 Claims, 5 Drawing Sheets

U.S. PATENT DOCUMENTS

| | | | |
|---|---|---|---|
| 5,138,174 A | | 8/1992 | Tang |
| 5,363,697 A | | 11/1994 | Nakagawa |
| 5,472,881 A | * | 12/1995 | Beebe et al. .................. 436/94 |
| 5,503,980 A | * | 4/1996 | Cantor .......................... 435/6 |
| 5,630,923 A | | 5/1997 | Aga et al. |
| 5,666,190 A | | 9/1997 | Quate et al. |
| 5,747,334 A | | 5/1998 | Kay et al. |
| 5,753,814 A | | 5/1998 | Han et al. |
| 5,831,181 A | | 11/1998 | Majumdar et al. |
| 5,846,909 A | | 12/1998 | McDevitt et al. |
| 5,874,668 A | | 2/1999 | Xu et al. |
| 5,908,692 A | | 6/1999 | Hamers et al. |
| 5,922,214 A | * | 7/1999 | Liu et al. ....................... 216/2 |
| 5,942,397 A | | 8/1999 | Tarlov et al. |
| 5,962,736 A | | 10/1999 | Zambias et al. |
| 5,985,356 A | | 11/1999 | Schultz et al. |

FOREIGN PATENT DOCUMENTS

| | | |
|---|---|---|
| WO | WO 98/04740 | 2/1998 |
| WO | WO 99/31267 | 6/1999 |
| WO | WO 99/48682 | 9/1999 |
| WO | WO 00/04382 A1 * | 1/2000 |
| WO | WO 00/04389 | 1/2000 |
| WO | WO 00/04390 | 1/2000 |
| WO | WO 00/36136 | 6/2000 |
| WO | WO 00/41213 | 7/2000 |
| WO | WO 00/46406 | 8/2000 |
| WO | WO 01/00876 | 1/2001 |
| WO | WO 01/51665 | 7/2001 |

OTHER PUBLICATIONS

Xu et al., "Nanometer-Scale Fabrication by Simultaneous Nanoshaving and Molecular Self-Assembly," Langmuir 1997, 13, 127-129.*
Xu et al., "Fabrication of Nanometer Scale Patterns within Self-Assembled Monolayers by Nanografting," Langmuir 1999, 15, 7244-7251.*
Hong et al., "Multiple Ink Nanolithography: Toward a Multiple-Pen Nano-Plotter," Science 286, 523 (1999).*
Amro et al., "Patterning Surfaces Using Tip-Directed Displacement and Self-Assembly," Langmuir 2000, 16, 3006-3009.*
Liu et al., "Nanofabrication of Self-Assembled Monolayers Using Scanning Probe Lithography," Acc. Chem. Res. 2000, 33, 457-466.*
Schwartz, "Meniscus Force Nanografting: Nanoscopic Patterning of DNA", Langmuir, Aug. 2001, vol. 17, No. 19, pp. 5971-5977.
International Search Report for International (PCT) Patent Application No. PCT/US01/50958, mailed Jun. 13, 2002.
International Preliminary Examination Report for International (PCT) Patent Application No. PCT/US01/50958, completed Feb. 5, 2003.
Abbott et al., Science, 257, 1380-1382 (1992).
Allara and Nuzzo, Langmuir, 1, 45 (1985).
Anwander et al., J. Phys. Chem. B, 104, 3532 (2000).
Bain, Adv. Mater. (Weinheim, Fed. Repub. Ger.), 4, 591-4 (1992).
Bansal et al., J. Phys. Chem. B, 102, 1067-1070 (1998).
Bansal et al., J. Phys. Chem. B, 102, 4058-4060 (1998).
Bernard et al., Langmuir, 14, 2225-2229 (1998).
Bottomley, Anal. Chem., 70:425R (1998).
Brazdil et al. J. Phys. Chem., 85, 1005-14 (1981).
Calvert, J. Vac. Sci. Technol. B, 11, 2155-2163 (1993).
Chang et al., Am. Chem. Soc., 116, 6792-805 (1994).
Chen et al., J. Am. Chem. Soc., 117, 6374-5 (1995).
Chen et al., Langmuir, 12, 2622-2624 (1996).
Chen et al., Langmuir, 15, 1075-1082 (1999).
Demers, C. A. Mirkin. R. C. Mucic, R. A. Reynolds, R. 1. Letsinger, Anal. Chem., submitted (2000).
Dubois and Nuzzo, Annu. Rev. Phys. Chem., 43, 437-63 (1992).
Edelstein et al. Biosensors and Bioelectronics 14, 805 (2000).
Elghanian, J.J. Storhoff, R.C. Mucic, R.L. Letsinger, C.A.Mirkin. Science, 277, 1078 (1997).
Ellison et al., J. Phys. Chem. B, 102, 8510-8518 (1998).
Ellison et al., J. Phys. Chem. B, 103, 6243-6251 (1999).
Eltekova and Eltekov, Langmuir, 3, 951 (1987).
Fenter et al., Langmuir, 7, 2013-16 (1991).
Fodor, Science 227, 393 (1997).
Frisbie et al., Science, 265, 2071-2074 (1994).
George et al., J. Am. Chem. Soc., 120, 1267 (1998).
Grabar et al., Anal. Chem., 67, 735-743.
Gu et al., J. Phys. Chem. B, 102, 9015-9028 (1998).
Gui et al., Langmuir, 7, 955-63 (1991).
Hamers et al., J. Phys. Chem. B, 101, 1489-1492 (1997).
Herne, M. J. Tarlov, J. Am. Chem. Soc. 119, 8916 (1997).
Henderson et al., Inorg. Chim. Acta, 242, 115-24 (1996).
Hickman et al., J. Am. Chem. Soc., 111, 7271 (1989).
Hickman et al., Langmuir, 8, 357-9 (1992).
Hidber et al., Langmuir, 12, 5209-5215 (1996).
Hong et al., Science, 286, 523-528 (1999).
Hovis et al., J. Phys. Chem. B, 101, 9581-9585 (1997).
Hovis et al., J. Phys. Chem. B, 102, 6873-6879 (1998).
Hovis et al., Surf. Sci., 402-404, 1-7 (1998).
Hubbard, Acc. Chem. Res., 13, 177 (1980).
Huc et al., J. Phys. Chem. B, 103, 10489-10495 (1999).
Huck et al., Langmuir, 15, 6862-6867 (1999).
Jarvis et al., Rev. Sci. Instrum, 67, 2281-2286 (1996).
Lahiri et al., Langmuir, 15, 2055-2060 (1999).
Laibinis et al., J. Am. Chem. Soc., 114, 1990-5 (1992).
Laibinis et al., Langmuir, 7, 3167-73 (1991).
Lee et al., J. Phys. Chem., 92, 2597 (1988).
Li et al., J. Phys. Chem., 98, 11751-5 (1994).
Lindsay et al., J. Vac. Sci. Technol. A., 11, 808-815 (1993).
Lo et al., J. Am. Chem. Soc., 118, 11295-11296 (1996).
Lunt et al., J. Appl. Phys., 70, 7449-67 (1991).
Lunt et al., J. Vac. Sci. Technol., B, 9, 2333-6 (1991).
Lutwyche et al., Sens. Actuators a, 73:89 (1999).
Maoz and Sagiv, Langmuir, 3, 1034 (1987).
Maoz and Sagiv, Langmuir, 3, 1045 (1987).
Matteucci and Caruthers, J. Am. Chem. Soc., 103, 3185-3191 (1981).
Mayya et al., J. Phys. Chem. B, 101, 9790-9793 (1997).
Menzel et al., Adv. Mater. (Weinheim, Ger.), 11, 131-134 (1999).
Meyer et al., J. Am. Chem. Soc., 110, 4914-18 (1988).
Minne et al., Appl. Phys. Lett., 73:1742 (1998).
Mirkin et al., Adv. Mater. (Weinheim, Ger.), 9, 167-173 (1997).
Mirkin et al., Chemphyschem., 2, 37-39 (2001).
Mirkin Inorg. Chem. 39, 2258-2272 (2000).
Mirkin, Mrs Bull., 25, 43 (2000).
Mucic et al. Chem. Commun. 555-557 (1996).
Mucic et al., J. Am. Chem. Soc., 120(48), pp. 12674-12675 (1998).
Muller et al., J. Vac. Sci. Technol. B, 13:2846 (1995).
Muller et al., Science, 268, 272 (1995).
Nakagawa et al., Jpn. J. Appl. Phys., Part 1, 30, 3759-62 (1991).
Noy et al., J. Am. Chem. Soc., 117, 7943-7951 (1995).
Noy et al., Langmuir, 14, 1508-1511 (1998).
Nuzzo et al., J. Am. Chem. Soc., 109, 2358 (1987).
Nyffenegger et al., Chem. Rev., 97:1195 (1997).
Patil et al., Langmuir, 14, 2707-2711 (1998).
Pereira et al., J. Mater. Chem., 10, 259 (2000).
Perkins et al., Appl. Phys. Lett., 68:550 (1996).
Piner et al., Science, 283, 661-663 (1999).
Porter et al., Langmuir, 14, 7378-7386 (1998).
Ross et al., Langmuir, 9, 632-636 (1993).
Sastry et al., J. Phys. Chem. B, 101, 4954-4958 (1997).
Schoer et al., Langmuir, 13:2323 (1997).
Sheen et al., J. Am. Chem. Soc., 114, 1514-15 (1992).
Slavov et al., J. Phys. Chem., 104, 983 (2000).
Solomun et al., J. Phys. Chem., 95, 10041-9 (1991).
Son et al., J. Phys. Chem., 98, 8488-93 (1994).
Song, J. H., Thesis, University of California at San Diego (1998).
Soriaga and Hubbard, J. Am. Chem. Soc., 104, 3937 (1982).
Steiner et al., Langmuir, 8, 2771-7 (1992).
Steiner et al., Langmuir, 8, 90-4 (1992).
Stewart et al., Rev. Sci. Instrum, 63, 5626-5635 (1992).
Storhoff et al., J. Am. Chem. Soc., 120, 1959 (1998).
Sugimura et al., J. Vac. Sci. Technol. A, 14:1223 (1996).
Tao, J. Am. Chem. Soc., 115, 4350-4358 (1993).

Taton, C. A. Mirkin, R. L. Letsinger, Science in press to appear Sep. 8, 2000.
Teal, IEEE Trans. Electron Dev. Ed-23, 621 (1976).
Timmons and Zisman, J. Phys. Chem., 69, 984-990 (1965).
Tsukamoto et al., Rev. Sci. Instrum., 62:1767 (1991).
Ulman, Chem. Rev., 96:1533 (1996).
Vettiger et al., Microelectron Eng., 46:11 (1999).
Walczak et al., J. Am. Chem. Soc., 113, 2370-8 (1991).
Wasserman et al., Langmuir, 5, 1074 (1989).
Weinberger et al., Advanced Materials, 12, 1600-1603 (2000).

Wilbur et al., Langmuir, 11, 825-831 (1995).
Xia and Whitesides, Angew. Chem. Int. Ed., 37, 550-575 (1998).
Xu and Liu, Langmuir, 13, 127-129 (1997).
Xu et al., Langmuir, 14, 6505-6511 (1998).
Yamamoto et al., Langmuir ACS ASAP, web release No. la990467r.
Yan et al., J. Am. Chem. Soc., 120, 6179-6180 (1998).
Yan et al., Langmuir, 15, 1208-1214 (1999).
Yonezawa et al., Chem. Mater., 11, 33-35 (1999) /Wpf/.

* cited by examiner

NANOLITHOGRAPHY METHODS AND PRODUCTS THEREFOR AND PRODUCED THEREBY

This application is a national stage application under 35 U.S.C. § 371 of PCT Application No. PCT/US 01/50958, filed Oct. 19, 2001, which claims benefit of priority under 35 U.S.C. § 119(e) U.S. Provisional Application Ser. No. 60/243,168, filed Oct. 20, 2000.

FIELD OF THE INVENTION

This invention relates to methods of nanolithography and products therefor and produced thereby.

BACKGROUND OF THE INVENTION

Lithographic methods are at the heart of modern day microfabrication, nanotechnology and molecular electronics. A variety of scanning probe lithography (SPL) techniques have been developed.

One such technique is dip pen nanolithograpy (DPN). See, e.g., Piner et al., Science, 283, 661-663 (1999); Hong et al., Science, 286, 523-528 (1999); Weinberger et al., Advanced Materials, 12, 1600-1603 (2000); Mirkin et al., CHEMPHYSCHEM., 2, 37-39 (2001); and PCT application WO 00/41213. DPN is a nanolithography technique by which molecules are directly transported to a substrate of interest in a positive printing mode. DPN utilizes a solid substrate as the "paper" and a scanning probe microscope (SPM) tip (e.g., an atomic force microscope (AFM) tip) as the "pen". The tip is coated with a patterning compound (the "ink"), and the coated tip is used to apply the patterning compound to the substrate to produce a desired pattern.

There are also a variety of negative printing techniques that rely on scanning probe instruments to pattern substrates using self-assembling monolayers and other organic materials as resist layers. See, e.g., Bottomley, Anal. Chem., 70:425R (1998); Nyffenegger et al., Chem. Rev., 97:1195 (1997); Schoer et al., Langmuir, 13:2323 (1997); Xu et al., Langmuir, 13:127 (1997); Perkins et al., Appl. Phys. Lett., 68:550 (1996); Xu and Liu, Langmuir, 13, 127-129 (1997); Langmuir et al., J. Vac. Sci. Technol. A, 14:1223 (1996); Muller et al., J. Vac. Sci. Technol. B, 13:2846 (1995); Abbott et al., Science, 257, 1380-1382 (1992); and U.S. Pat. No. 5,922,214. One such technique is nanografting. See Xu and Liu, Langmuir, 13, 127-129 (1997) and U.S. Pat. No. 5,922,214. In nanografting, a layer of material on a substrate is mechanically displaced using an AFM tip. The displacement is carried out in a fluid containing molecules which rapidly enter the void created by the AFM tip and bind to the clean substrate surface. A third technique is the nanopen reader and writer (NPRW) technique which combines DPN and nanografting. See Amro et al., Langmuir, 16, 3006-3009 (2000). A monolayer of molecules on a substrate is used as a resist, and an AFM tip is used to displace molecules of the monolayer from desired locations. The tip is pre-coated with molecules different from the molecules that form the monolayer. As the tip displaces the molecules of the monolayer, the molecules on the tip adsorb onto the freshly exposed substrate following the track of the tip.

Microfabrication techniques such as photolithography, microcontact printing, micromachining, and microwriting can produce patterns as small as 100 nm, but the production of sub-100 nm structures still poses a challenge. Amro et al., Langmuir, 16, 3006-3009 (2000). At present, such high-resolution fabrication can be achieved using SPL techniques. Id.

Accordingly, additional and improved SPL techniques would be highly desirable for use in a variety of fields.

SUMMARY OF THE INVENTION

The invention provides a method of nanolithography referred to herein as High Force Nanograffing (HFN). This method comprises providing a substrate and coating at least a portion of the substrate with a resist. A patterning compound is applied to at least a portion of the substrate that is coated with the resist. A tip is used to produce a desired pattern of the patterning compound on the substrate by removing the resist from the substrate with the tip, whereupon the patterning compound attaches to the substrate from which the resist has been removed. The removal of the resist is achieved as a result of the application of a high force to the substrate by the tip.

The invention further provides a method of altering a substrate. The method comprises providing a substrate and a tip and using the tip to apply a high force to the substrate to produce a flattened area, an indentation, a groove or another feature on the substrate.

The invention also provides a resist for use in nanolithographic patterning of a patterning compound comprising a nucleic acid on a substrate. The resist comprises a compound having the formula X—$(CH_2)_n$—SH, wherein n is at least 1 and X is a nucleotide or an oligonucleotide comprising at least 2 nucleotides.

The invention further provides a submicrometer array. The array comprises a plurality of discrete sample areas arranged in a pattern on a substrate, each sample area being a predetermined shape, and at least one dimension of each of the sample areas, other than depth, being less than 1 µm. The substrate further comprising a resist occupying the non-sample areas of the substrate.

The invention also provides a method of forming a three-dimensional structure on a substrate. The method comprises:

(a) providing a substrate comprising a foundation layer applied to the substrate by nanografting or high force nanografting, the foundation layer comprising a resist and one or more patterning compounds applied on the substrate in a desired pattern;

(b) providing a structure-forming compound;

(c) applying the structure-forming compound to the foundation layer; and (d) repeating steps (b) and (c) if necessary and as many times as necessary with as many additional structure-forming compounds as necessary to form the desired three-dimensional structure.

Finally, the invention provides an improved method of dip pen nanolithography. The method comprising performing dip pen nanolithography by providing a substrate and a tip, coating the tip with a solution of a patterning compound, and contacting the coated tip with the substrate so that the compound is applied to the substrate so as to produce a desired pattern. The improvement comprises providing the patterning compound in a solution comprising an additive.

BRIEF DESCRIPTION OF THE DRAWINGS

FIG. 4A—oligonucleotide-nanoparticle conjugates (nanoparticles of 13 nm diameter) hybridized to a line patterned by MFN with a patterning compound comprising a complementary nucleic acid sequence. FIG. 4B—additional different oligonucleotide-nanoparticle conjugates (nanoparticles of 30 nm diameter) hybridized to a different line patterned by MFN with a patterning compound comprising a complementary nucleic acid sequence. The nanoparticles of different sizes attached to the two different lines can be readily identified.

DETAILED DESCRIPTION OF THE PRESENTLY PREFERRED EMBODIMENTS

Figure 1:
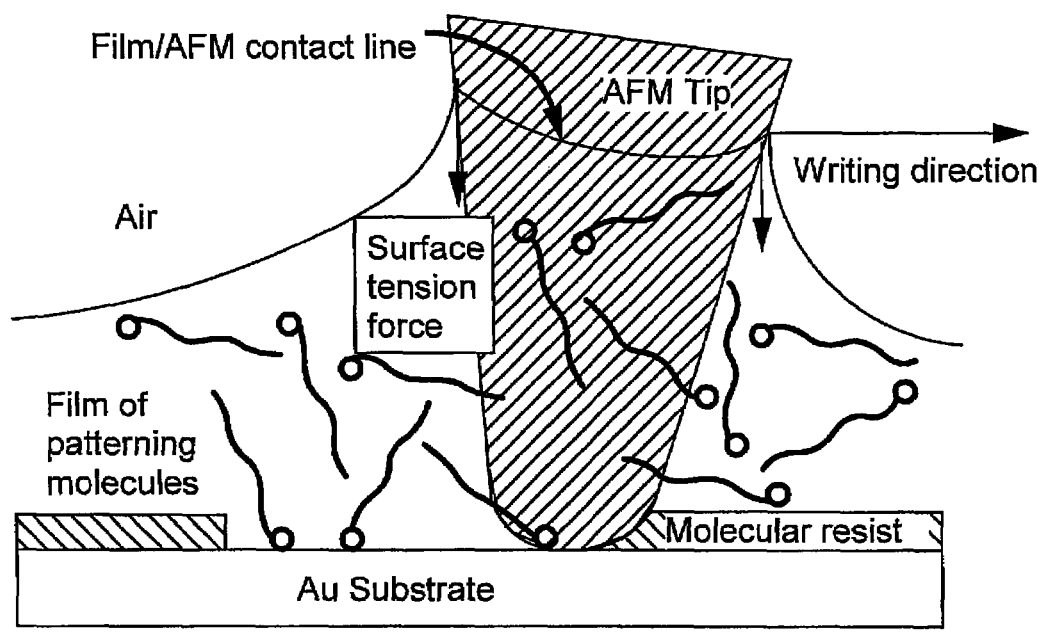
FIG. 1. Schematic representation of a form of High Force Nanografting (HFN) referred to as Meniscus Force Nanografting (MFN). A drop of a patterning compound in solution is applied by a tip to a resist-coated substrate to form a thin film of the patterning compound proximate the tip. The molecules of the patterning compound are prevented from bonding to the substrate surface by a molecular resist. The resist is selectively removed by the tip, allowing patterning molecules to have access to the substrate surface and bond. A high normal force between the tip and substrate is provided by the surface tension of the thin film of patterning fluid.

The invention provides a method of nanolithography referred to as High Force Nanografting (HFN). HFN utilizes a tip. The tip must be usable in an atomic force microscope (AFM) or similar device (see below). Suitable tips include scanning probe microscope (SPM) tips, and tips having similar properties, including tips made especially for HFN using the guidelines provided herein. As used herein, the phrases "scanning probe microscope tips" and "SPM tips" are used to mean tips used in atomic scale imaging. Suitable SPM tips include AFM tips, near field scanning optical microscope (NSOM) tips, and scanning tunneling microscope (STM) tips. Many suitable SPM tips are available commercially (e.g., from Park Scientific, Digital Instruments, Molecular Imaging, Thermomicroscopes, Digital Instruments Nanonics Ltd. and Topometrix). Alternatively, SPM tips can be made by methods well known in the art. For instance, SPM tips can be made by e-beam lithography. Most preferably, the tip is an AFM tip. Any AFM tip can be used, and suitable AFM tips include those that are available commercially from, e.g., Park Scientific, Digital Instruments and Molecular Imaging.

The substrate may be of any shape and size. In particular, the substrate may be flat or curved. Substrates may be made of any material which can be modified by a patterning compound to form stable surface structures (see below). Substrates useful in the practice of the invention include metals (e.g., gold, silver, aluminum, copper, platinum, and paladium), metal oxides (e.g., oxides of Al, Ti, Fe, Ag, Zn, Zr, In, Sn and Cu), semiconductor materials (e.g., Si, CdSe, CdS and CdS coated with ZnS), magnetic materials (e.g., ferromagnetite), polymers or polymer-coated substrates, superconductor materials ($YBa_2Cu_3O_{7-8}$), Si, $SiO_2$, glass, AgI, AgBr, $HgI_2$, PbS, PbSe, ZnSe, ZnS, ZnTe, CdTe, InP, $InP_2O_3/SnO_2$, $In_2S_3$, $In_2Se_3$, $In_2Te_3$, $Cd_3P_2$, $Cd_3As_2$, InAs, AlAs, GaP, GaAs, and indium tin oxide. Methods of making such substrates are well-known in the art and include evaporation and sputtering (metal films), crystal semiconductor growth (e.g., Si, Ge, GaAs), chemical vapor deposition (semiconductor thin films), epitaxial growth (crystalline semiconductor thim films), and thermal shrinkage (oriented polymers). See, e.g., Alcock et al., *Canadian Metallurgical Quarterly*, 23, 309 (1984); Holland, *Vacuum Deposition of Thin Films* (Wiley, New York 1956); Grove, *Philos. Trans. Faraday Soc.*, 87 (1852); Teal, *IEEE Trans. Electron Dev.* ED-23, 621 (1976); Sell, *Key Eng. Materials*, 58, 169 (1991); Keller et al., *Float-Zone Silicon* (Marcel Dekker, New York, 1981); Sherman, *Chemical Vapor Deposition For Microelectronics: Principles, Technology And Applications* (Noyes, Park Ridges, N.J., 1987); *Epitaxial Silicon Techlnology* (Baliga, ed., Academic Press, Orlando, Fla., 1986); U.S. Pat. No. 5,138,174; Hidber et al., *Langmuir*, 12, 5209-5215 (1996). Suitable substrates can also be obtained commercially from, e.g., Digital Instruments (gold), Molecular Imaging (gold), Park Scientific (gold), Electronic Materials, Inc. (semiconductor wafers), Silicon Quest, Inc. (semiconductor wafers), MEMS Technology Applications Center, Inc. (semiconductor wafers), Crystal Specialties, Inc. (semiconductor wafers), Siltronix, Switzerland (silicon wafers), Aleene's, Buellton, Calif. (biaxially-oriented polystyrene sheets), and Kama Corp., Hazelton, Pa. (oriented thin films of polystyrene). Gold substrates are preferred.

At least a portion of the substrate is coated with a resist. Any resist can be used provided (i) it is capable of binding to the substrate in such a manner so that it can be removed by a tip contacted with the substrate with high force and (ii) it is capable of passivating the substrate to the patterning and structure-forming compounds (e.g., it prevents a patterning compound from binding to a substrate when applied in a thin film over the resist before patterning with a tip). Many suitable resists and the corresponding substrate(s) for the resists are known in the art. For example:

a. Compounds of the formula $R_1SH$, $R_1SSR_2$, $R_1SR_2$, $R_1SO_2H$, $(R_1)_3P$, $R_1NC$, $R_1CN$, $(R_1)_3N$, $R_1COOH$, or ArSH can be used as resists on gold substrates;

b. Compounds of formula $R_1SH$, $(R_1)_3N$, or ArSH can be used as resists on silver, copper, palladium and semiconductor substrates;

c. Compounds of the formula $R_1NC$, $R_1SH$, $R_1SSR_2$, or $R_1SR_2$ can be used as resists on platinum substrates;

d. Compounds of the formula $R_1SH$ can be used as resists on aluminum, $TiO_2$, $SiO_2$, GaAs and InP substrates;

e. Organosilanes, including compounds of the formula $R_1SiCl_3$, $R_1Si(OR_2)_3$, $(R_1COO)_2$, $R_1CH=CH_2$, $R_1Li$ or $R_1MgX$, can be used as resists Si, $SiO_2$ and glass substrates;

f. Compounds of the formula $R_1COOH$ or $R_1CONHR_2$ can be used as resists on metal oxide substrates;

g. Compounds of the formula $R_1SH$, $R_1NH_2$, $ArNH_2$, pyrrole, or pyrrole derivatives wherein $R_1$ is attached to one of the carbons of the pyrrole ring, can be used as resists on cuprate high temperature superconductors;

h. Compounds of the formula $R_1PO_3H_2$ can be used to pattern $ZrO_2$ and $In_2O_3/SnO_2$ substrates;

i. Compounds of the formula R$_1$COOH can be used as resists on aluminum, copper, silicon and platinum substrates;
j. Compounds that are unsaturated, such as azoalkanes (R$_3$NNR$_3$) and isothiocyanates (R$_3$NCS), can be used as resists on silicon substrates;
k. Proteins and peptides can be used as resists on gold, silver, glass, silicon, and polystyrene; and
l. Silazanes can be used as resists on SiO$_2$ and oxidized GaAs.

In the above formulas:
R$_1$ and R$_2$ each has the formula X(CH$_2$)n and, if a compound is substituted with both R$_1$ and R$_2$, then R$_1$ and R$_2$ can be the same or different;
R$_3$ has the formula CH$_3$(CH$_2$)n;
n is 0-30;
Ar is an aryl;
X is —CH$_3$, —CHCH$_3$, —COOH, —CO$_2$(CH$_2$)$_m$CH$_3$, —OH, —CH$_2$OH, ethylene glycol, hexa(ethylene glycol), —O(CH$_2$)$_m$CH$_3$, —NH$_2$, —NH(CH$_2$)$_m$NH$_2$, halogen, glucose, maltose, fullerene C60, a nucleotide, an oligonucleotide, a nucleic acid (DNA, RNA, etc.), a protein (e.g., an antibody or enzyme) or a ligand (e.g., an antigen, enzyme substrate or receptor); and
m is 0-30.

For a description of compounds that can be used as resists and their preparation and use, see Xia and Whitesides, *Angew. Chem. Int. Ed.*, 37, 550-575 (1998) and references cited therein; Bishop et al., *Curr. Opinion Colloid & Interface Sci.*, 1, 127-136 (1996); Calvert, *J. Vac. Sci. Technol. B*, 11, 2155-2163 (1993); Ulman, *Chem. Rev.*, 96:1533 (1996) (alkanethiols on gold); Dubois et al., *Annu. Rev. Phys. Chem.*, 43:437 (1992) (alkanethiols on gold); Ulman, *An Introduction to Ultrathin Organic Films: From Langmuir-Blodgett to Self-Assembly* (Academic, Boston, 1991) (alkanethiols on gold); Whitesides, *Proceedings of the Robert A. Welch Foundation 39th Conference On Chemical Research Nanophase Chemistry*, Houston, Tex., pages 109-121 (1995) (alkanethiols attached to gold); Mucic et al. *Chem. Commun.* 555-557 (1996) (describes a method of attaching 3' thiol DNA to gold surfaces); U.S. Pat. No. 5,472,881 (binding of oligonucleotide-phosphorothiolates to gold surfaces); Burwell, *Chemical Technology*, 4, 370-377 (1974) and Matteucci and Caruthers, *J. Am. Chem. Soc.*, 103, 3185-3191 (1981) (binding of oligonucleotides-allylsiloxanes to silica and glass surfaces); Grabar et al., *Anal. Chem.*, 67, 735-743 (binding of aminoalkylsiloxanes and for similar binding of mercaptoallylsiloxanes); Nuzzo et al., *J. Am. Chem. Soc.*, 109, 2358 (1987) (disulfides on gold); Allara and Nuzzo, *Langmuir*, 1, 45 (1985) (carboxylic acids on aluminum); Allara and Tompkins, *J. Colloid Interface Sci.*, 49, 410-421 (1974) (carboxylic acids on copper); Iler, *The Chemistry Of Silica*, Chapter 6, (Wiley 1979) (carboxylic acids on silica); Timmons and Zisman, *J. Phys. Chem.*, 69, 984-990 (1965) (carboxylic acids on platinum); Soriaga and Hubbard, *J. Am. Chem. Soc.*, 104, 3937 (1982) (aromatic ring compounds on platinum); Hubbard, *Acc. Chem. Res.*, 13, 177 (1980) (sulfolanes, sulfoxides and other functionalized solvents on platinum); Hickman et al., *J. Am. Chem. Soc.*, 111, 7271 (1989) (isonitriles on platinum); Maoz and Sagiv, *Langmuir*, 3, 1045 (1987) (silanes on silica); Maoz and Sagiv, *Langmuir*, 3, 1034 (1987) (silanes on silica); Wasserman et al., *Langmuir*, 5, 1074 (1989) (silanes on silica); Eltekova and Eltekov, *Langmuir*, 3, 951 (1987) (aromatic carboxylic acids, aldehydes, alcohols and methoxy groups on titanium dioxide and silica); and Lec et al., *J. Phys. Chem.*, 92, 2597 (1988) (rigid phosphates on metals); Lo et al., *J. Am. Chem. Soc.*, 118, 11295-11296 (1996) (attachment of pyrroles to superconductors); Chen et al., *J. Am. Chem. Soc.*, 117, 6374-5 (1995) (attachment of amines and thiols to superconductors); Chen et al., *Langmuir*, 12, 2622-2624 (1996) (attachment of thiols to superconductors); McDevitt et al., U.S. Pat. No. 5,846,909 (attachment of amines and thiols to superconductors); Xu et al., *Langmuir*, 14, 6505-6511 (1998) (attachment of amines to superconductors); Mirkin et al., *Adv. Mater.* (Weinihein:, Ger.), 9, 167-173 (1997) (attachment of amines to superconductors); Hovis et al., *J. Phys. Chem. B*, 102, 6873-6879 (1998) (attachment of olefins and dienes to silicon); Hovis et al., *Surf. Sci.*, 402-404, 1-7 (1998) (attachment of olefins and dienes to silicon); Hovis et al., *J. Phys. Chem. B*, 101, 9581-9585 (1997) (attachment of olefmis and dienes to silicon); Hamers et al., *J. Phys. Chem. B*, 101, 1489-1492 (1997) (attachment of olefins and dienes to silicon); Hamers et al., U.S. Pat. No. 5,908,692 (attachment of olefins and dienes to silicon); Ellison et al., *J. Phys. Chem. B*, 103, 6243-6251 (1999) (attachment of isothiocyanates to silicon); Ellison et al., *J. Phys. Chem. B*, 102, 8510-8518 (1998) (attachment of azoalkanes to silicon); Ohno et al., *Mol. Cryst. Liq. Cryst. Sci. Technol., Sect. A*, 295, 487-490 (1997) (attachment of thiols to GaAs); Reuter et al., *Mater. Res. Soc. Symp. Proc.*, 380, 119-24 (1995) (attachment of thiols to GaAs); Bain, *Adv. Mater.* (Weinheim, Fed. Repub. Ger.), 4, 591-4 (1992) (attachment of thiols to GaAs); Sheen et al., *J. Am. Chem. Soc.*, 114, 1514-15 (1992) (attachment of thiols to GaAs); Nakagawa et al., *Jpn. J. Appl. Phys., Part 1*, 30, 3759-62 (1991) (attachment of thiols to GaAs); Lunt et al., *J. Appl. Phys.*, 70, 7449-67 (1991) (attachment of thiols to GaAs); Lunt et al., *J. Vac. Sci. Technol., B*, 9, 2333-6 (1991) (attachment of thiols to GaAs); Yamamoto et al., *Langmuir* ACS ASAP, web release number Ia 990467r (attachment of thiols to InP); Gu et al., *J. Phys. Chem. B*, 102, 9015-9028 (1998) (attachment of thiols to InP); Menzel et al., *Adv. Mater.* (Weinheim, Ger.), 11, 131-134 (1999) (attachment of disulfides to gold); Yonezawa et al., *Chem. Mater.*, 11, 33-35 (1999) (attachment of disulfides to gold); Porter et al., *Langmuir*, 14, 7378-7386 (1998) (attachment of disulfides to gold); Son et al., *J. Phys. Chem.*, 98, 8488-93 (1994) (attachment of nitriles to gold and silver); Steiner et al., *Langmuir*, 8, 2771-7 (1992) (attachment of nitriles to gold and copper); Solomun et al., *J. Phys. Chem.*, 95, 10041-9 (1991) (attachment of nitriles to gold); Solomun et al., *Ber. Bunsen-Ges. Phys. Chem.*, 95, 95-8 (1991) (attachment of nitriles to gold); Henderson et al., *Inorg. Chim. Acta*, 242, 115-24 (1996) (attachment of isonitriles to gold); Huc et al., *J. Phys. Chem. B*, 103, 10489-10495 (1999) (attachment of isonitriles to gold); Hickman et al., *Langmuir*, 8, 357-9 (1992) (attachment of isonitriles to platinum); Steiner et al., *Langmuir*, 8, 90-4 (1992) (attachment of amines and phospines to gold and attachmnent of amines to copper); Mayya et al., *J. Phys. Chem. B*, 101, 9790-9793 (1997) (attachment of amines to gold and silver); Chen et al., *Langmuir*, 15, 1075-1082 (1999) (attachment of carboxylates to gold); Tao, *J. Am. Chem. Soc.*, 115, 4350-4358 (1993) (attachment of carboxylates to copper and silver); Laibinis et al., *J. Am. Chem. Soc.*, 114, 1990-5 (1992) (attachment of thiols to silver and copper); Laibinis et al., *Langmuir*, 7, 3167-73 (1991) (attachment of thiols to silver); Fenter et al., *Langmuir*, 7, 2013-16 (1991) (attachment of thiols to silver); Chang et al., *Am. Chem. Soc.*, 116, 6792-805 (1994) (attachment of thiols to silver); Li et al., *J. Phys. Chem.*, 98, 11751-5 (1994) (attachment of thiols to silver); Li et al., *Report* 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., *Langmuir;* 7, 955-63 (1991) (attachment of thiols to silver); Walczak et al., *J. Am. Chem. Soc.*, 113, 2370-8 (1991) (attachment of thiols to silver); Sangiorgi et al., *Gazz. Chim. Ital.*, 111, 99-102 (1981) (attachment of amines to copper); Magallon et al., *Book of Abstracts, 215th ACS National Meeting, Dallas, Mar. 29-Apr. 2, 1998*, COLL-048 (attachment of amines to copper); Patil et al., *Langmuir* 14, 2707-2711 (1998) (attachment of amines to silver); Sastry et al., *J. Phys. Chem. B*, 101, 4954-4958 (1997) (attachment of amines to silver); Bansal et al., *J. Phys. Chem. B*, 102, 4058-4060 (1998) (attachment of alkyl lithium to silicon); Bansal et al., *J. Phys. Chem. B*, 102, 1067-1070 (1998) (attachment of alkyl lithium to silicon); Chidsey, *Book of Abstracts, 214th ACS National Meeting, Las Vegas, Nev. Sep. 7-11, 1997*, I & EC-027 (attachment of alkyl lithium to silicon); Song, J. H., Thesis, University of California at San Diego (1998) (attachment of alkyl lithium to silicon dioxide); Meyer et al., *J. Am. Chem. Soc.*, 110, 4914-18 (1988) (attachment of amines to semiconductors); Brazdil et al. *J. Phys. Chem.*, 85, 1005-14 (1981) (attachment of amines to semiconductors); James et al., *Langmuir,* 14, 741-744 (1998) (attachment of proteins and peptides to glass); Bernard et al., *Langmuir,* 14, 2225-2229 (1998) (attachment of proteins to glass, polystyrene, gold, silver and silicon wafers); Pereira et al., *J. Mater. Chem.*, 10, 259 (2000) (attachment of silazanes to $SiO_2$); Pereira et al., *J. Mater. Chem.*, 10, 259 (2000) (attachment of silazanes to $SiO_2$); Dammel, *Diazonaphthoquinone Based Resists* ($1^{st}$ ed., SPIE Optical Engineering Press, Bellingham, Wash. 1993) (attachment of silazanes to $SiO_2$); Anwander et al., *J. Phys. Chem. B,* 104, 3532 (2000) (attachment of silazanes to $SiO_2$); Slavov et al., *J. Phys. Chem.*, 104, 983 (2000) (attachment of silazanes to $SiO_2$).

Additional resists can include compounds and materials that cannot be removed from the substrate with a tip operated at standard forces (i.e., those forces at which an AFM is normally operated for imaging and patterning by means other than HFN, about 20 nN or less) and can be removed with a tip operated at the high forces used in HFN. For instance, an oxide layer over metal that passivates the metal from attachment of the patterning compound to the metal could be used since, in HFN, the tip could disrupt the first few atomic layers of the substrate, making the underlying metal vulnerable to attachment of the patterning compound.

A resist for use with a patterning compound comprising a nucleotide, an oligonucleotide or a nucleic acid is preferably negatively-charged. A preferred resist for use with a patterning compound comprising a nucleotide, an oligonucleotide or a nucleic acid comprises a compound having the formula X—$(CH_2)_n$—SH, wherein n is at least 1, preferably 1-30, most preferably 5-15, and X is an nucleotide or an oligonucleotide comprising at least 2 nucleotides, preferably at least 10 oligonucleotides, most preferably 10-30 nucleotides. Another preferred resist for use with a patterning compound comprising a nucleic acid comprises this compound in combination with a compound having the formula Y—$(CH_2)_n$—SH, wherein n is at least 1, preferably 1-30, most preferably 5-15, and Y is —$CH_3$, —COOH, —OH, or —$CH_2OH$. The oligonucleotide X may have any sequence which does not interfere with the ability of the patterning compound to be bound to the substrate or to function as desired after patterning (e.g., X does not interfere with the ability of the patterning compound to bind a structure-forming compound comprising a nucleic acid, the sequence of which is complementary to at least a portion of the sequence of the nucleic acid of the patterning compound). The bases of the nucleotides of X are preferably all adenines, all thymines, all cytidines, or all guanines. More preferably, the bases are all adenines or all thymines, most preferably the bases are all thymines.

Other compounds known in the art besides those listed above, or which are developed or discovered using the guidelines provided herein or otherwise, can also be used as the resist.

The resist can be applied to the substrate in a number of ways, and suitable methods are known in the art. For instance, the substrate can be coated with the resist by vapor deposition. See Sherman, *Chemical Vapor Deposition For Microelectronics: Principles, Technology And Applications* (Noyes, Park Ridges, N.J., 1987. Briefly, a resist (in pure form, solid or liquid, no solvent) is placed on a solid surface (e.g., glass or silicon nitride; available from Fisher Scientific or MEMS Technology Application Center), and the substrate is positioned near (within about 1-20 cm, depending on chamber design) the resist. The resist is then heated to a temperature at which it vaporizes, thereby coating the substrate with the compound. For instance, 1-octadecanethiol can be vapor deposited at 45-60° C. Coating by vapor deposition should be performed in a closed chamber to prevent contamination of other areas. If the resist is one which is oxidized by air, the chamber should be a vacuum chamber or a nitrogen-filled chamber. Coating the substrates by vapor deposition produces thin, uniform layers of resists on the substrates.

Preferably, however, the substrate is coated by dipping or immersing it in a solution of the resist. The solvent is preferably one that adheres to (wets) the substrate very well. The substrate is maintained in contact with the solution of the resist for a time sufficient for the resist to coat the substrate. Such times can be determined empirically. The substrate may be dipped or immersed in the solution once or multiple times, with the substrate being dried after each dipping or immersion. The number of times a substrate needs to be dipped or immersed in a chosen solution can be determined empirically. Preferably, the substrate is dried by blowing an inert gas (such as carbon tetrafluoride, 1,2-dichloro-1,1,2,2,-tetrafluoroethane, dichlorodifluoromethane, octafluorocyclobutane, trichlorofluoromethane, difluoroethane,nitrogen, nitrogen, argon or dehumidified air) not containing any particles (i.e., purified) over the substrate.

A patterning compound is applied to at least a portion of the resist-coated substrate. The patterning compound can be applied to the resist-coated substrate in a number of ways.

For instance, the patterning compound can be applied so as to cover the entire portion of the substrate that is coated with the resist. This can be accomplished by vapor deposition of the patterning compound on the substrate before patterning in the same manner as described above for the resist. Alternatively, the substrate could be coated by vapor deposition occurring simultaneously with patterning by, e.g., placing a drop of the patterning compound next to the AFM stage and performing the patterning in a closed environment.

The patterning compound can also be applied by immersion of the substrate in a fluid cell containing a solution of the patterning compound as in standard nanografting (see, e.g., Xu and Liu, *Langmuir,* 13, 127-129 (1997) and U.S. Pat. No. 5,922,214). The solvent is not critical; all that is required is that the patterning compound be in solution.

The patterning compound can also be applied by solution deposition, spin coating, molecular beam deposition, and vacuum deposition.

Alternatively and preferably, the patterning compound is applied by forming a drop of a solution of a patterning compound on the tip that is to be used to produce a pattern of the patterning compound. This can be accomplished by bringing the tip into contact with a solution of the patterning compound. The tip with the drop of the patterning compound is moved to that area of the substrate where the pattern is to be produced. Once the tip is above the area of the substrate that is to be patterned, the tip is lowered until the drop contacts the resist-covered substrate to apply a thin film of the patterning compound to a limited area proximate the tip. The drop "contacts" the substrate when it is close enough so that a meniscus which bridges the gap between the tip and the resist-coated substrate forms. The amount of area that is covered by the patterning compound will depend on the size and viscosity of the drop. The size of the drop can be adjusted by, for instance, dipping the tip in a solution of the patterning compound to form a drop and touching the tip, once or multiple times, to a clean surface to remove excess solution (the size of the drop can be judged by, e.g., the size of the "puddle" of the patterning compound left on the clean surface). This form of HFN utilizing drops of patterning compound is referred to as Meniscus Force Nanografting (MFN).

Any patterning compound can be used, provided it is capable of modifying the substrate to form stable surface structures. Stable surface structures are formed by chemisorption or physiorption of the molecules of the patterning compound onto the substrate or by covalent linkage of the molecules of the patterning compound to the substrate.

Many suitable compounds which can be used as the patterning compound, and the corresponding substrate(s) for the compounds, are known in the art. For example:

a. Compounds of the formula $R_1SH$, $R_1SSR_2$, $R_1SR_2$, $R_1SO_2H$, $(R_1)_3P$, $R_1NC$, $R_1CN$, $(R_1)_3N$, $R_1COOH$, or ArSH can be used to pattern gold substrates;

b. Compounds of formula $R_1SH$, $(R_1)_3N$, or ArSH can be used to pattern silver, copper, palladium and semiconductor substrates;

c. Compounds of the formula $R_1NC$, $R_1SH$, $R_1SSR_2$, or $R_1SR_2$ can be used to pattern platinum substrates;

d. Compounds of the formula $R_1SH$ can be used to pattern aluminum, $TiO_2$, $SiO_2$, GaAs and InP substrates;

e. Organosilanes, including compounds of the formula $R_1SiCl_3$, $R_1Si(OR_2)_3$, $(R_1COO)_2$, $R_1CH=CH_2$, $R_1Li$ or $R_1MgX$, can be used to pattern on Si, $SiO_2$ and glass substrates;

f. Compounds of the formula $R_1COOH$ or $R_1CONHR_2$ can be used to pattern metal oxide substrates;

g. Compounds of the formula $R_1SH$, $R_1NH_2$, $ArNH_2$, pyrrole, or pyrrole derivatives wherein $R_1$ is attached to one of the carbons of the pyrrole ring, can be used to pattern cuprate high temperature superconductors;

h. Compounds of the formula $R_1PO_3H_2$ can be used to pattern $ZrO_2$ and $In_2O_3/SnO_2$ substrates;

i. Compounds of the formula $R_1COOH$ can be used to pattern aluminum, copper, silicon and platinum substrates;

j. Compounds that are unsaturated, such as azoalkanes ($R_3NNR_3$) and isothiocyanates ($R_3NCS$), can be used to pattern silicon substrates;

k. Proteins and peptides can be used to pattern gold, silver, glass, silicon, and polystyrene; and l. Silazanes can be used to pattern $SiO_2$ and oxidized GaAs.

In the above formulas:

$R_1$ and $R_2$ each has the formula $X(CH_2)n$ and, if a compound is substituted with both $R_1$ and $R_2$, then $R_1$ and $R_2$ can be the same or different;

$R_3$ has the formula $CH_3(CH_2)n$;

n is 0-30;

Ar is an aryl;

X is $-CH_3$, $-CHCH_3$, $-COOH$, $-CO_2(CH_2)_mCH_3$, $-OH$, $-CH_2OH$, ethylene glycol, hexa(ethylene glycol), $-O(CH_2)_mCH_3$, $-NH_2$, $-NH(CH_2)_mNH_2$, halogen, glucose, maltose, fullerene C60, a nucleotide, an oligonucleotide, a nucleic acid (DNA, RNA, etc.), a protein (e.g., an antibody or enzyme) or a ligand (e.g., an antigen, enzyme substrate or receptor); and m is 0-30.

For a description of patterning compounds and their preparation and use, see the references cited above in connection with the description of resists. Other compounds known in the art besides those listed above, or which are developed or discovered using the guidelines provided herein or otherwise, can also be used as the patterning compound.

It has been found that for patterning with patterning compounds comprising a nucleotide, an oligonucleotide or a nucleic acid, the solution must contain a salt (preferably a salt of a divalent metal), a cationic surfactant or both at particular concentrations (i.e., particular salt:base ratios which can be determined empirically) to give a solution that does not allow the patterning compound to penetrate certain resists, particularly resists of formula $X-(CH_2)_n-SH$ (see above). $MgCl_2$ at a salt:base ratio of 22-27 has been found to work best.

The tip is used to form a desired pattern of the patterning compound on the substrate. The pattern may be any pattern and may be simple or complex. For instance, the pattern may be a dot, a line, a cross, a geometric shape (e.g, a triangle, square or circle), combinations of two or more of the foregoing, arrays (e.g., a square array of rows and columns of dots), electronic circuits, or part of, or a step in, the formation of a three-dimensional structure.

To form the pattern, the tip is brought into contact with the substrate. The tip is "in contact" with the substrate when it is penetrates the resist layer and actually touches the substrate.

HFN is performed using an AFM or a device performing similar functions and having similar properties, including devices developed especially for performing HFN using the guidelines provided herein, using techniques that are conventional and well known in AFM microscopy. Briefly, the substrate is placed in the sample holder of the device, and the substrate is contacted with the tip(s). The substrate is scanned so that the tip(s) remove the resist from the substrate, whereupon the patterning compound(s) attach(es) to the bare substrate from which the resist has been removed to form the desired pattern. A high force on the tip(s) is used during the scanning. By "high force" is meant a normal force greater than that necessary to simply remove the adsorbed molecules of the resist and which allows patterning independent of a need for AFM feedback. Generally, a normal force of greater than 30 nN, preferably greater than 100 nN, will be used. It is anticipated that forces of up to 2 μN are achievable.

This high force can be achieved in a number of ways. For instance, the force could be achieved by the use stiffer cantilevers than currently used, and the flexing of the cantilevers would provide the high force.

In yet another alternative, the force could be supplied by an electrical field. For instance, AFM tips are often gold-coated on the top for reflectivity and are made of an insulating substance, such as silicon nitride or silicon. For patterning on a metallic substrate, the tip can be electrically biased relative to the substrate. The force that can be obtained will depend on the metal used to coat the top of the tip, the area of the metal-coated surface, the identity of the metal used to coat the top of the tip, the identity of the metal of which the substrate is composed, the field strength, and the pressure (e.g. higher forces can be obtained under vacuum conditions). It is expected that forces of 30-300 nN or greater can easily be achieved.

In a further alternative, the force could be supplied by a magnetic field, e.g., as described in Jarvis et al., *Rev. Sci. Instrum,* 67, 2281-2286 (1996); Lindsay et al., J. Vac. Sci. Technol. A., 11, 808-815 (1993); Stewart et al., *Rev. Sci. Instum,* 63, 5626-5635 (1992). For instance, force could be applied magnetically to a cantilever with a magnetic material located behind the tip by a current-carrying coil. Jarvis et al., *Rev. Sci. Instrum,* 67, 2281-2286 (1996). For instance, a cube of ferromagnetic material that is 20 μm on a side in a magnetic field with a gradient of 100 T/m would experience a force of about 600 nN. Various parameters could be varied to attain the desired force, including the magnetic field, the size of the cube of ferromagnetic material, and the type of ferromagnetic material.

Surprisingly, it has been found that the required high displacement force can be provided solely by the surface tension of a drop of the patterning compound, and this preferred form of HFN is referred to as MFN. The force the tip applies to the substrate is equal to the surface tension of the thin film (about 70 mN/m for water and most aqueous solutions) times the length of the line of contact between the film and the tip (i.e., the circumference of the interface where the drop ofpatterning compound surrounds the tip that is in the drop). The length of the line of contact between the film and the tip depends on the size of the drop,.and in MFN, the displacement force can be controlled by tailoring the size of the drops (see above). For large drops (about 3 μm in width), a perpendicular force of 200 nN to 2 μN has been calculated based on observation of the cantilever's deflection with an optical microscope. This very large force results in large gigapascal pressures on the substrate which have been found to cause slight indentations (about 1-5 angstroms deep) in a gold substrate and to cause flattening of a gold substrate. Thus, it is expected that HFN and MFN could be used to flatten or make indentations, grooves or other features in at least soft substrates, such as gold substrates.

In HFN, the need for AFM feedback control is eliminated. As a consequence, HFN can proceed extraordinarily fast. To date, it has been possible to pattern lines as fast as 320 μm/second, three orders of magnitude faster than conventional nanografting and two orders of magnitude faster than DPN performed with a dry tip.

Single tips can be used to produce one or more patterns of a patterning compound on a substrate. Alternatively, a plurality of tips can be used in a single AFM or similar device to produce a plurality of patterns (the same pattern or different patterns) on the substrate (see, e.g., U.S. Pat. Nos. 5,630,923, and 5,666,190, Lutwyche et al., *Sens. Actuators A,* 73:89 (1999), Vettiger et al., *Microelectron Eng.,* 46:11 (1999), Minne et al., *Appl. Phys. Lett.,* 73:1742 (1998), and Tsukamoto et al., *Rev. Sci. Instrum.,* 62:1767 (1991) which describe devices comprising multiple cantilevers and tips for patterning a substrate). When a plurality of tips is used, the tips can be used serially or in parallel to produce patterns on the substrate.

If it is desired to produce patterns of more than one patterning compound which overlap on the substrate, any unbound first patterning compound must be removed from the substrate before applying a second patterning compound. The unbound first patterning compound can be removed by rinsing the substrate. Any solvent or solution and conditions may be used that are not harmful to the patterning compound and resist that are attached to the substrate. After removal of the unbound first patterning compound, more resist (the same one or a different one) is applied to at least the portion of the substrate on which the pattern of the first patterning compound was produced to cover any bare substrate. Application of additional resist may not be necessary if the first patterning compound adequately covers and passivates the substrate from which the resist has been removed. The resist is applied as described above (e.g., vapor deposition or immersion in a solution of the resist). Then, a second patterning compound is applied to at least a portion of the substrate that is coated with resist. The second patterning compound is applied in the same manner as described above. A desired pattern of the second patterning compound on the substrate is produced in the same manner as described above using one or a plurality of tips substantially free of the first patterning compound. A tip substantially free of the first patterning compound can be a new tip or it can be the tip used to apply the first patterning compound which has been cleaned to remove the first patterning compound. The cleaning of tips can be accomplished by rinsing them in a solvent in which the patterning compound is soluble (e.g., by simply dipping the tips in the solvent). The solvent is preferably the solvent in which the patterning compound is most soluble. These steps can be repeated as many times as necessary to pattern the substrate with as many different patterning compounds as desired.

In the case of MFN, more than one patterning compound can be used to pattern a substrate simultaneously by applying drops of each of the patterning compounds to the substrate from a plurality of tips. Each of the drops applied to the substrate by the tips covers only a limited area proximate the tip used to apply it. Thus, the plurality of tips must be spaced sufficiently apart and the size of the drops must be tailored so that there is no overlap of the different patterning compounds after they are applied. Of course, the plurality of tips could also be used to apply a plurality of drops of a single patterning compound in order to produce a plurality of patterns (the same pattern or different patterns) of that patterning compound.

HFN can be used to prepare arrays, including combinatorial arrays. An "array" is an arrangement of a plurality of discrete sample areas in a pattern on a substrate. The sample areas may be any shape (e.g., dots, circles, squares or triangles) and may be arranged in any pattern (e.g., rows and columns of discrete sample areas). Each sample area may contain the same or a different sample as contained in the other sample areas of the array. A "combinatorial array" is an array wherein each sample area or a small group of replicate sample areas (usually 2-4) contain(s) a sample which is different than that found in other sample areas of the array. A "sample" is a material or combination of materials to be studied, identified, reacted, etc.

HFN will be particularly useful for the preparation of arrays on the submicrometer scale. An "array on the submicrometer scale" means that at least one of the dimensions (e.g, length, width or diameter) of the sample areas, excluding the depth, is less than 1 μm. At present, HFN can be used to prepare lines that are 15 nm in width. Arrays on a submicrometer scale allow for faster reaction times and the use of less reagents than the currently-used microscale (i.e., having dimensions, other than depth, which are 1-999 μm) and larger arrays. Also, more information can be gained per unit area (i.e., the arrays are more dense than the currently-used micrometer scale arrays). Finally, the use of submicrometer arrays provides new opportunities for screening. For instance, such arrays can be screened with SPM's to look for physical changes in the patterns (e.g., shape, stickiness, height) and/or to identify chemicals present in the sample areas, including sequencing of nucleic acids (see below).

Each sample area of an array contains a single sample. For instance, the sample may be a biological material, such as a nucleic acid (e.g., an oligonucleotide, DNA, or RNA), protein or peptide (e.g., an antibody or an enzyme), ligand (e.g., an antigen, enzyme substrate, receptor or the ligand for a receptor), or a combination or mixture of biological materials (e.g., a mixture of proteins). Such materials may be attached directly on a desired substrate by HFN or each sample area may contain a compound attached by HFN for capturing the biological material. See, e.g, PCT applications WO 00/04382, WO 00/04389 and WO 00/04390, the complete disclosures of which are incorporated herein by reference. For instance, patterning compounds terminating in certain functional groups (e.g., —COOH) can bind proteins through a functional group present on, or added to, the protein (e.g.,— $NH_2$). Also, it has been reported that polylysine, which can be attached to the substrate as described above, promotes the binding of cells to substrates. See James et al., Langmuir, 14, 741-744 (1998). It has further been reported that cells bind to octadecanethiol-coated surfaces, As another example, each sample area may contain a chemical compound (organic, inorganic and composite materials) or a mixture of chemical compounds. Chemical compounds may be deposited directly on the substrate or may be attached through a functional group present on a patterning compound present in the sample area. From the foregoing, those skilled in the art will recognize that a patterning compound may comprise a sample or may be used to capture a sample.

Arrays and methods of using them are known in the art. For instance, such arrays can be used for biological and chemical screenings to identify and/or quantify a biological or chemical material (e.g., immunoassays, enzyme activity assays, genomics, and proteomics). Biological and chemical libraries of naturally-occurring or synthetic compounds and other materials, including cells, can be used, e.g., to identify and design or refine drug candidates, enzyme inhibitors, ligands for receptors, and receptors for ligands, and in genomics and proteomics. References describing combinatorial arrays and other arrays and their uses include U.S. Pat. Nos. 5,747,334, 5,962,736, and 5,985,356, and PCT applications WO 96/31625, WO 99/31267, WO 00/04382, WO 00/04389, WO 00/04390, WO 00/36136, and WO 00/46406.

Results of experiments performed on the arrays of the invention can be detected by conventional means (e.g., fluorescence, chemiluminescence, bioluminescence, and radioactivity). Alternatively, an SPM or SEM can be used for screening arrays. For instance, an AFM can be used for quantitative imaging and identification of molecules, including the imaging and identification of chemical and biological molecules through the use of an SPM tip coated with a chemical or biomolecular identifier. See Frisbie et al., *Science*, 265, 2071-2074 (1994); Wilbur et al., *Langmuir*, 11, 825-831 (1995); Noy et al., *J. Ami. Chem. Soc.*, 117, 7943-7951 (1995); Noy et al., *Langmuir*, 14, 1508-1511 (1998); and U.S. Pat. Nos. 5,363,697, 5,372,93, 5,472,881 and 5,874,668, the complete disclosures of which are incorporated herein by reference. Using an SPM or SEM to detect the results of experiments performed on the arrays holds the promise of being able to detect a single molecule of a compound (e.g., a single molecule of DNA without amplification).

HFN can also be used in the preparation of three-dimensional structures. For instance, HFN can be used to produce one or more patterns of one or more patterning compounds on a substrate. The first layer of compounds on the substrate (the resist and the one or more patterning compounds) will be referred to as the foundation layer. It will also be appreciated that the foundation layer could be prepared by conventional nanografting. See Xu and Liu, *Langmuir*, 13, 127-129 (1997) and U.S. Pat. No. 5,922,214. After the foundation layer is completed, structure-forming compounds are added to the foundation layer to form the three-dimensional structure. The three-dimensional structure may be simple (e.g., addition of one structure-forming compound to add a single desired feature or property to the foundation layer) or complex (e.g., addition of many structure-forming compounds to add multiple features and/or properties and/or to form multiple layers). Three-dimensional structures maybe any micro- or nano-scale device, system, material, etc., and the term "three-dimensional structure" is used herein to distinguish such structures from those micro- or nano-scale devices, systems, materials, etc. produced by applying the patterning compounds to the substrate by HFN or nanograffing (i.e., those structures comprised only of the foundation layer).

A structure-forming compound may be any compound that reacts chemically or otherwise stably combines (e.g., by hybridization of two complimentary strands of nucleic acid) with the patterning compound(s) or with the resist of the foundation layer. The structure-forming compound may be one of the patterning compounds described above or a functionalized patterning compound. By "functionalized" is meant that the patterning compound has been altered chemically (e.g., a carboxylate group has been reacted with an alcohol to produce an ester or has been reacted with an amino acid to produce a peptide linkage, etc.) or has a physical material (e.g., a nanoparticle) attached to it. The structure-forming compound may also be a compound that functionalizes, e.g., a particular patterning compound (e.g., converting a carboxylate group on patterning compounds to interchain anhydride groups or converting an azide group on the patterning compound to an amino group), a compound (e.g., a chemical or biological molecule) that has been functionalized to bind to a capture compound (i.e., a compound designed to capture chemical, biological molecules or other materials). For examples of structure-forming compounds, see Dubois and Nuzzo, *Annu. Rev. Phys. Chem.*, 43, 437-63 (1992); Muller et al., *Science*, 268, 272 (1995); Bishop and Nuzzo, *Current Opinion in Colloid & Interface Science*, 1, 127-136 (1996); Yan et al., *J. Am. Chem. Soc.*, 120, 6179-6180 (1998); Yan et al., *Langmuir*, 15, 1208-1214 (1999); Lahiri et al., *Langmuir*, 15, 2055-2060 (1999); and Huck et al., *Langmuir*, 15, 6862-6867 (1999); PCT applications WO 00/04389, 00/04382, 00/04390; and PCT applications WO 98/04740, 01/00876 and 01/51665 (oligonucleotides functionalized with nanoparticles and other particles and their use for detection of nucleic acids and to prepare various nanostructures and nanomaterials). In a particularly preferred embodiment, at least one of the patterning compounds and/or one of the compounds of the resist and at least one of the structure-forming compounds comprise nucleic acids (e.g., oligonucleotides), and the three-dimensional structure is formed, at least in part, by the hybridization of nucleic acids comprising complementary sequences.

The structure-forming compound can be applied by, e.g., DPN (see, e.g.,), microcontact printing (see, e.g, Xia and Whitesides, *Angew. Chem. Ind. Ed.*, 37, 550-575 (1998); James et al., *Langmuir*, 14, 741-744 (1998); Bernard et al., *Langmuir*, 14, 2225-2229 (1998); Huck et al., *Langmuir*, 15, 6862-6867 (1999)), by immersion of the substrate on which the foundation layer has been formed in a solution of the structure-forming compound (see, e.g, Ross et al., *Langmuir*, 9, 632-636 (1993); Bishop and Nuzzo, *Curr. Opinion in Colloid & Interface Science*, 1, 127-136 (1996); xia and Whitesides, *Angew. Chem. Ind. Ed.*, 37, 550-575 (1998); Yan et al., Langmuir, 15, 1208-1214 (1999); Lahiri et al., Langmuir, 15, 2055-2060 (1999); Huck et al., Langmuir, 15, 6862-6867 (1999)), or any other method.

In summary, HFN is a powerful and extremely rapid method for patterning substrates at resolutions comparable to those achieved with much more expensive and sophisticated competitive lithographic methods, such as electron-beam lithography. HFN is a useful tool for creating microscale and nanoscale structures. For instance, HFN can be used in the fabrication of microsensors, microreactors, combinatorial arrays, micromechanical systems, microanalytical systems, biosurfaces, biomaterials, microelectronics, microoptical systems, and nanoelectronic devices. See, e.g., Xia and Whitesides, Angew. Chem. Int. Ed., 37, 550-575 (1998).

Finally, HFN can be used to alter a substrate. The high force used in HFN has been found to cause an indentation or groove in gold substrates, and it is expected that HFN can be used to alter of at least soft substrates, such as gold substrates. For instance, HFN can be used to flatten an area of a substrate (using a flattened tip) or to produce indentations or grooves (using a sharp tip) or other features on a substrate.

Finally, the invention provides an improved method of dip pen nanolithography. The method comprises performing dip pen nanolithography as described in, e.g, PCT application WO 00/41213, the complete disclosure of which is incorporated herein by reference. Briefly, a tip is coated with a solution of a patterning compound, and the coated tip is contacted with a substrate so that the compound is applied to the substrate so as to produce a desired pattern. The tips, substrates, and patterning compounds are the same ones described above for performing HFN. The improvement comprises providing the patterning compound in a solution comprising an additive. The additive may be, e.g., a salt or a surfactant. It has been found that the solution is preferably in equilibrium with the relative humidity and with the vapor pressure of a solvent.

It is to be noted that the term "a" or "an" entity refers to one or more of that entity, including mixtures of the entities of two or more of the entities. As such, the terms "a" (or "an"), "one or more" and "at least one" are used interchangeably herein. It is also to be noted that the terms "comprising," "including," and "having" have been used interchangeably.

EXAMPLES

Example 1

Preparation of a Three-Dimensional Structure on a Gold Substrate Using Meniscus Force Nanografting Gold substrates were prepared as follows. Polished single-crystalline Si(100) wafers were coated with 5 nm of Ti, followed by at least 10 nm of Au by thermal evaporation. The Si(100) wafers (4" diameter (1-0-0) wafers; 3-4.9 ohm/cm resistivity; 500-550 µm thickness) were purchased from Silicon Quest International, Inc. (Santa Clara, Calif.). Thermal evaporation of 5 nm of Ti (99.99%; Alfa Aesar; Ward Hill, Mass.) followed by 10 nm of Au (99.99%; D. F. Goldsmith; Evanston, Ill.) was accomplished using an Edwards Auto306 Turbo Evaporator equipped with a turbopump (Model EXT510) and an Edwards FTM6 quartz crystal microbalance to determine film thickness. Au and Ti depositions were conducted at room temperature at a rate of 3 angstroms/second and a pressure of $10^{-7}$ torr.

The resist was composed of alkanethiol-oligonucleotides of the composition 5'-SH—$(CH_2)_6$-$(T)_{10}$ (hereinafter "10-T"). 10-T was synthesized and purified as described in Example 1 of PCT application WO 98/04740. The resist was applied to the substrate by immersing the substrate in a solution of 10 µM 10-T in 1 M $MgCl_2$ for at least one hour at room temperature (the solution can be left to equilibrate with the atmosphere, as it will concentrate, but not dry). After the incubation, the substrate was washed with nanopure water and dried with difluoroethane.

Figure 2:
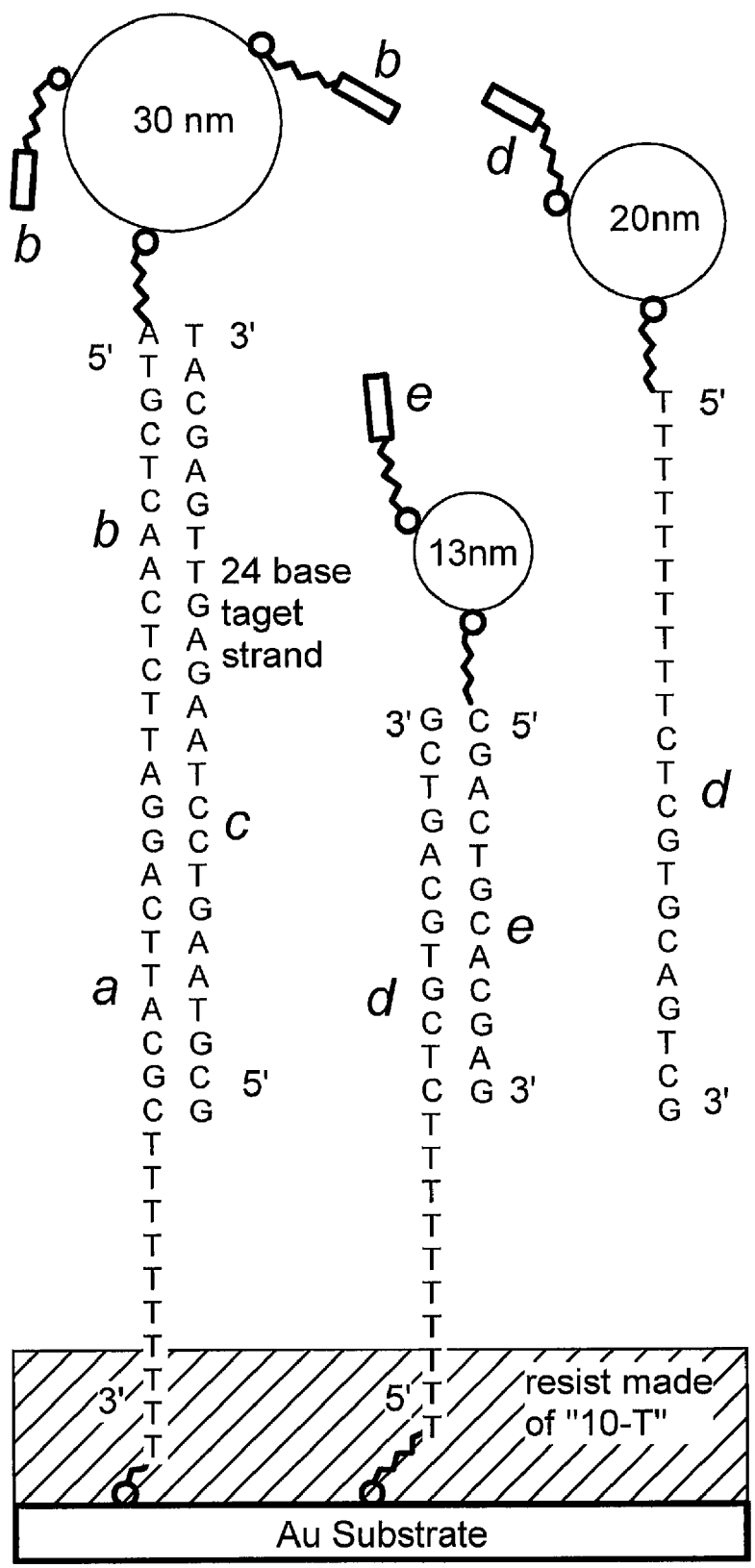
FIG. 2. Schematic representation illustrating the production of three-dimensional structures utilizing hybridization of nucleic acids to produce the three-dimensional structure.

Patterning compound A, 5'-SH—$(CH_2)_6$-$(T)_{10}$-$(N)_{12}$, was prepared as described above for 10-T. $(T)_{10}$-$(N)_{12}$ of patterning compound A is an oligonucleotide that will be referred to as "oligonucleotide strand A." The sequence $(N)_{12}$, wherein N=any nucleotide, of oligonucleotide strand A is complementary to at least a portion of the sequence of oligonucleotide strand C (see below and FIG. 2).

Standard Thermomicroscopes coated (the top surface is covered with gold), sharpened microlevers were purchased, and the A cantilever was used. Octadecanethiol (ODT) was deposited on the top of the cantilevers by immersion in a 1 mM solution of ODT in acetonitrile for 1 hour. The ODT chemisorbed to the upper gold-coated surface and formed a passivating monolayer. After being thoroughly rinsed in ethanol, a thin layer of gold (between 5 nm and 10 nm of gold) on 5 nm of a titanium binder was vapor deposited on the bottom of the cantilevers (the silicon nitride tips) as described above for the gold substrates. The tips were then immersed in a few drops of an aqueous solution of 10-T (10 µM in 1 M $MgCl_2$) at room temperature for about one hour. Water evaporates and concentrates the 10-T/$MgCl_2$ solution, but the presence of the $MgCl_2$ prevents the drying of the solution in all but the driest conditions. After rinsing with nanopure water and drying under ambient conditions, the tips were ready for use.

A solution of patterning compound A was prepared by making a solution of 10 µM patterning compound A in a solution of $MgCl_2$ in water at a salt:base ratio of 27. This solution was thoroughly dried under nitrogen gas and then exposed to an atmosphere of 50% relative humidity, whereupon the dried salt absorbed enough water to become a rather thick solution. A drop of patterning compound A was formed on a tip (prepared as described above) mounted in the AFM instrument (a Park Scientific Model CP AFM instrument was used for all experiments) by dipping the tip in this somewhat viscous solution. The tip was then touched to a bare gold substrate several times until a drop of the desired size (about 1 µm diameter or slightly larger) was obtained (as judged by the "puddle" of the patterning compound left on the bare gold substrate or by optical microscopy). Then, the tip was moved to a desired location over the resist-coated substrate, and the drop was applied by lowering the tip so that the drop contacted the substrate. Immediately after application of the drop, the tip was used to prepare a pattern of lines. This was accomplished by moving the tip across the substrate in the desired pattern at the desired speed (it has been found that speeds of 10-320 µm/second can be used and that essentially identical lines can be produced regardless of the speed, and it is likely that higher speeds can be used). After scanning, unbound patterning compound A was washed from the substrate by immersing the substrate in nanopure water. After drying with difluoroethane, additional 10-T resist was applied as described above to coat any bare substrate.

Structure-forming compound C, which was an oligonucleotide strand B having the sequence $(N)_{24}$, at least a portion of which is complementary to the $(N)_{12}$ sequence of oligonucleotide strand A and at least a portion of which is complementary to the sequence of oligonucleotide strand B (see below and FIG. 2), was synthesized as described in Example 1 of PCT application WO 98/04740. It was applied to the patterned substrate by immersing the substrate in a solution of the structure-forming compound C (10 µM of compound C in 1 MNaCl, 10 mM phosphate, pH 7.0) for an hour at room temperature so that oligonucleotide strand C hybridized to oligonucleotide strand A (see FIG. 3). The substrate was washed with a 1 M solution of ammonium acetate and dried with difluoroethane.

Next, structure-forming compound B was applied to the substrate. Structure-forming compound B was 3'-SH—$(CH_2)_6$—$(N)_{12}$ attached to 30 nm gold. To prepare structure-forming compound B, 3'-SH—$(CH_2)_6$—$(N)_{12}$ was synthesized as described in Example 1 of PCT application WO 98/04740 and attached to the nanoparticles as described in Example 3 of PCT application WO 98/04740. Also see Storhoff et al., *J. Am. Chem. Soc.*, 120, 1959 (1998) and Mucic et al., *J. Am. Chem. Soc.*, 120, 1267 (1998). The oligonucleotide strand, $(N)_{12}$, which had a sequence complementary to at least a portion of the sequence of oligonucleotide strand C (see FIG. 2), is referred to herein as oligonucleotide strand B. Structure-forming compound B was applied to the substrate by immersing the substrate in a solution of the compound (5 nM of structure-forming compound C in 0.3 M NaCl, 10 mM phosphate, pH 7.0) for an hour at room temperature so that oligonucleotide strand B hybridized to oligonucleotide strand C. The substrate was washed with 1 M ammonium acetate and dried with difluoroethane.

Figure 3:
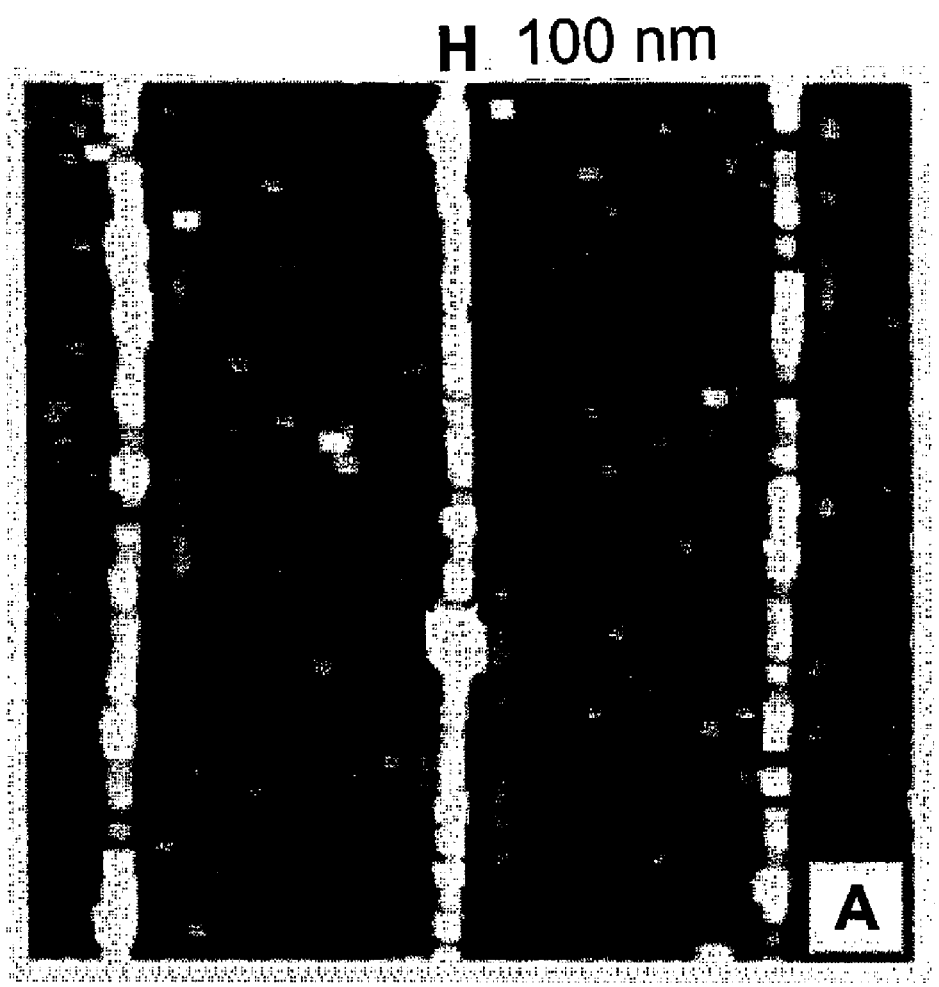
FIG. 3. AFM topography image of oligonucleotide-nanoparticle conjugates (nanoparticles 30 nm in diameter) hybridized to a gold substrate patterned with a nucleic acid patterning compound by MFN.

The substrate was scanned (contact mode) with a tip dipped in dodecylamine to reduce friction to produce an AFM topography image (FIG. 3). Patterning with a sharp tip resulted in a continuous fine line indicated by the single-file row of 30 nm nanoparticles (FIG. 3). As the nanoparticles are staggered by less than 15 nm, it is reasonable to assume that the width of the patterned line is as thin as or thinner than 15 nm. A wider line resulted from use of a suspected flattened tip (data not shown).

Example 2

Preparation of a Three-Dimensional Structure on a Gold Substrate Using Nanograffing Gold substrates were prepared as described in Example 1. The substrates were coated with a resist composed of a combination of 10-T and mercaptohexanol (MCH) (hereinafter the "10-T/MCH" resist). The 10-T/MCH resist was applied to the substrate as follows. First, 10-T was prepared, purified and applied to the substrate, all as described in Example 1. After washing the substrate with nanopure water and drying it with difluoroethane, it was placed in a closed container with a few drops of MCH (Aldrich) and left in the closed container for 3 hours at room temperature to apply the MCH by vapor deposition. After the three-hour incubation, the substrate was washed in ethanol and dried with difluoroethane.

Patterning compound A (preparation described in Example 1) was applied to the substrate by standard nanografting as described in Xu and Liu, *Langmuir*, 13, 127 (1997) with some modifications. In particular, the resist was nanoshaved from the substrate surface under 1-butanol using Thermomicroscopes contact ultralevers with a displacement force of 20 nN in a fluid cell. Although the hydrophilic 10-T does not dissolve in butanol and, therefore, most likely is not displaced, the MCH is readily displaced in this process. Free of the passivating presence of the interdigitating MCH, the gold surface is vulnerable to subsequent attachment of the patterning compound. A 1 µl drop of patterning compound A (10 µM) in an aqueous solution of $MgCl_2$ was applied to the substrate. The substrate was washed in nanopure water to remove unbound patterning compound A, and any bare substrate was coated with MCH by vapor deposition as described above.

Then, structure-forming compound C was applied as described above, after which a structure-forming compound comprising oligonucleotide strand B attached to 13 nm nanoparticles was applied as described above.

Optical micrographs of the substrate (performed using the Park Scientific CP AFM optics) prepared with the 10-T/MCH resist and a substrate prepared with the 10-T resist (Example 1) showed that both resists prevented non-specific adsorption to the substrate of nanoparticles. It was found that the 10-T resist was better at preventing the nonspecific adsorption of nanoparticles. However, the 10-T resist was not able to passivate the gold surface to additional attachment of thiol-modified oligonucleotides unless the solution of oliogonucleotides was in a concentrated solution of divalent salt. In particular, it has been found that for patterning with patterning compounds comprising a nucleic acid in an aqueous solution, the solution must contain a salt at particular salt:base ratios (which can be determined empirically) to give a solution that will not penetrate the 10-T resist prior to being patterned with a tip. The 10-T/MCH resist did passivate the gold substrate against attachment of thiol-modified oligonucleotides when applied in solutions of moderate salt concentrations (1M $MgCl_2$). As a consequence, the composition of the solution of oligonucleotides (with no attached nanoparticles) need not be controlled as carefully as when 10-T/MCH is used as the resist.

Example 3

Preparation of a Three-Dimensional Structure on a Gold Substrate Using Meniscus Force Nanografting Gold substrates were prepared and coated with 10-T resist as described in Example 1. Patterning compound A was prepared and applied to the substrate as described in Example 1. After application of patterning compound A, any bare substrate was coated with 10-T as described in Example 1, and the tip was rinsed with nanopure water and dried with difluoroethane.

Then, patterning compound D was prepared and applied to the substrate with the rinsed tip as described in Example 1, after which the substrate was again coated with 10-T resist as described in Example 1. Patterning compound D was identical to patterning compound A, except that the $(N)_{12}$ sequence of oligonucleotide strand D was different than the $(N)_{12}$ sequence of oligonucleotide strand A (see FIG. 2). Patterning compounds A and D were patterned in parallel lines less than 500 nm apart.

Structure-forming compounds B, C and E (see FIG. 2) were prepared and applied to the substrate as described in Example 1. Structure-forming compound E comprises oligonucleotide strand E attached to 13 nm nanoparticles, and oligonucleotide strand E has a sequence that is complementary to at least a portion of the sequence of patterning compound D (see FIG. 2).

After washing and drying the substrate, structure-forming compound D comprising oligonucleotide strand D (sequence identical to that of patterning compound D; see FIG. 2) attached to 20 nm gold nanoparticles was prepared and applied to the substrate as described in Example 1 for the structure-forming compound B.

A substrate prepared as described in Example 1 with no resist on it was patterned with patterning compound A by dip pen nanolithography (DPN) as described in PCT application WO 00/41213, the complete disclosure of which is incorporated herein by reference, using tips prepared as described in Example 1 (hydrophilic tips have been found to be coated better with patterning compounds comprising a nucleotide, oligonucleotide or a nucleic acid). It has been found that for patterning by DPN with patterning compounds comprising an oligonucleotide or a nucleic acid in an aqueous solution, the solution should preferably contain a salt at particular concentrations (i.e., particular salt:base ratios which can be determined empirically) to give a substance that absorbs enough waters of hydration at the relative humidity (which can be controlled) to be a solution rather than a solid. Furthermore, if this salt is a surfactant (such as tridodecylamine at a salt:base ratio of 27), the resulting solution will pattern in a more controllable manner. It is expected that similar principles may apply for other patterning compounds that comprise other ionic polymers and that salts (e.g., $MgCl_2$, NaCl, $NH_4COO^-$), including surfactants (e.g., tridodecylmethylamine, squaleen, tween), may advantageously be included in aqueous solutions of such patterning compounds. Accordingly, patterning compound A (10 µM) was contained in an aqueous solution of tridodecylmethylamine at a salt:base ratio of 27. The exact molarity of the oligonucleotide patterning compound and surfactant can be controlled by controlling the exact relative humidity in which the experiment talkes place. After patterning, the substrate was thoroughly washed with nanopure water, dried with difluoroethane and coated with 10-T resist as described in Example 1. Then, structure-forming compound C was applied as described above, after which a structure-forming compound comprising oligonucleotide strand B attached to 13 mn nanoparticles was applied as described above.

A substrate was prepared and patterned with patterning compound A by standard nanografting as described in Example 2. Then, structure-forming compound C was applied as described above, after which a structure-forming compound comprising oligonucleotide strand B attached to 13 nm nanoparticles was applied as described above.

AFM topographs and optical micrographs were performed as described in Examples 1 and 2. Scanning electron micrographs (SEMs) of the MFN patterned substrates were prepared on a Hitachi SEM.

Figure 4A:
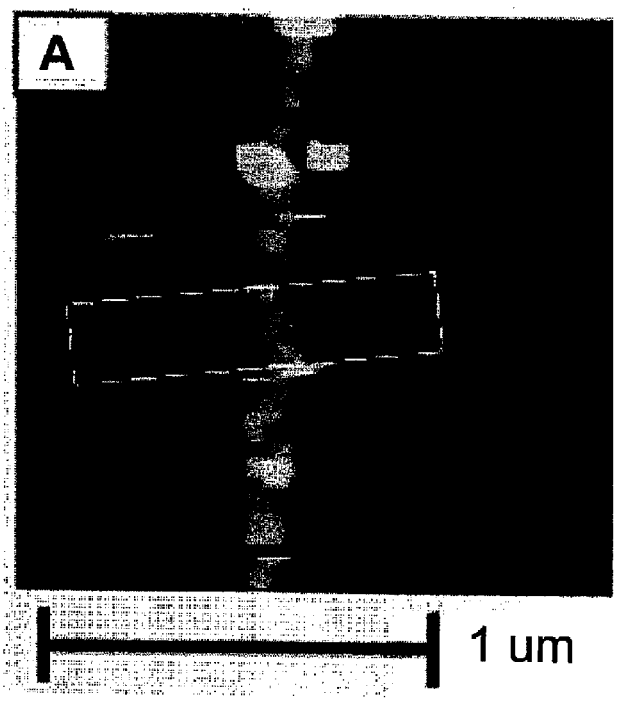
FIGS. 4A-B. AFM topography images of oligonucleotide-nanoparticle conjugates hybridized to a gold substrate patterned with lines of two different nucleic acid patterning compounds by MFN.
Figure 4B:
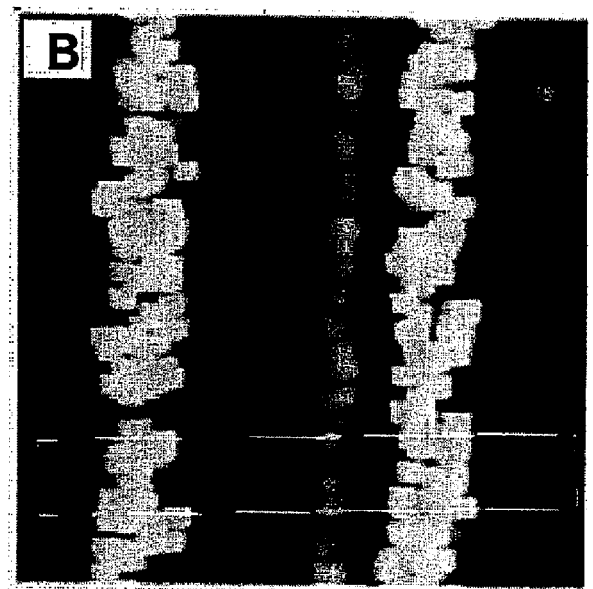
Figure 4C:
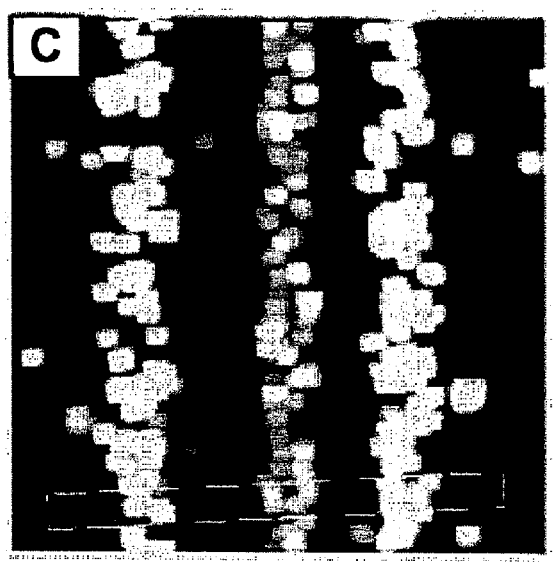
FIG. 4C. AFM topography image showing oligonucleotide-nanoparticle conjugates (nanoparticles of 20 nm diameter) hybridized to the oligonucleotide-nanoparticle conjugates (nanoparticles of 13 nm diameter) of FIG. 4A (middle line).
Figure 4D:
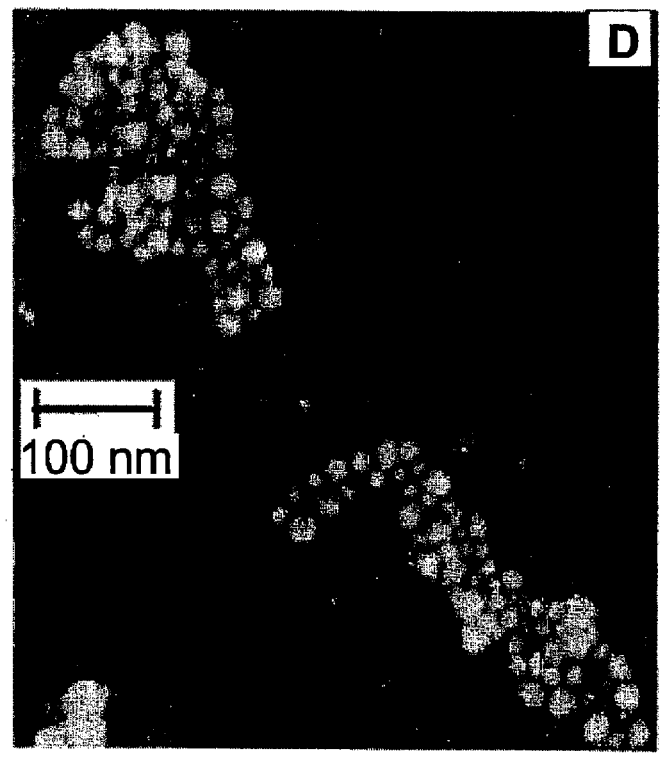
FIG. 4D. Scanning electron microscope (SEM) image of oligonucleotide-nanoparticle conjugates (nanoparticles of 20 nm diameter) hybridized to the oligonucleotide-nanoparticle conjugates (nanoparticles of 13 nm diameter) of FIG. 4A. The 13 nm nanoparticles can be distinguished from the 20 nm nanoparticles on the same line, and both of them can be distinguished from the 30 nm nanoparticles of the adjacent line (lower left).

The AFM topographs for MFN are presented in FIGS. 4A-C and an SEM is presented in FIG. 4D. As can be seen, the different sizes of nanoparticles could be distinguished. The different sizes of nanpoparticles of structure-forming compounds C and E attached only to the patterned lines of corresponding complementary strands, and the nanoparticles of structure-forming compound D attached only to the nanoparticles of structure-forming compound E.

Line widths as small as or smaller than 15 nm were observed. In contrast, DPN gave line widths of about 100 nm. Although nanografting gave line widths of about the same size as did MFN, MFN could be performed at speeds of up to three orders of magnitude faster than nanografting. MFN could also be performed at speeds of up to two orders of magnitude faster than DPN.

What is claimed:

1. A method of nano lithography comprising:
providing a substrate;
coating at least a portion of the substrate with a resist;
providing a tip with a drop of patterning compound on the tip;
applying the tip to a portion of the substrate coated with the resist wherein a high normal force is formed between the tip and the substrate by the surface tension of the drop of patterning compound on the tip that forms a thin film of the patterning compound on the substrate in an area proximate the tip; and,
moving the tip to remove resist from the substrate, whereupon the patterning compound attaches to the substrate from which the resist has been removed by the tip to form a pattern of the patterning compound on the substrate.

2. The method of claim 1, wherein a plurality of tips is used to each apply a drop of the patterning compound to the substrate so that a plurality of separate films of the patterning compound, each covering a limited area proximate a tip, are formed.

3. The method of claim 2 wherein a plurality of patterning compounds is applied to the substrate.

4. The method of claim 1 wherein a desired pattern of a first patterning compound is produced and the method further comprises:
  a. removing any unbound first patterning compound from the substrate;
  b. applying a resist to at least a portion of the substrate on which the pattern of the first patterning compound has been produced;
  c. applying a second patterning compound to at least a portion of the substrate that is coated with the resist;
  d. providing a tip substantially free of the first patterning compound; and
  e. producing a desired pattern of the second patterning compound on the substrate by removing the resist from the substrate with the tip substantially free of the first patterning compound, whereupon the second patterning compound attaches to the substrate from which the resist has been removed.

5. The method of claim 4 wherein steps a-e are repeated to produce one or more patterns of one or more additional patterning compounds on the substrate.

6. The method of claim 1 wherein a desired pattern of a patterning compound is produced on the substrate and the method further comprises applying a structure-forming compound to the substrate to produce a three-dimensional structure.

7. The method of claim 6 wherein the patterning compound comprises a nucleic acid and the structure-forming compound comprises a nucleic acid having a sequence complementary to at least a portion of the sequence of the nucleic acid of the patterning compound, and the three-dimensional structure is formed as a result of the hybridization of the nucleic acids of the patterning compound and structure-forming compound.

8. The method of claim 1 wherein the pattern is an array of a plurality of discrete sample areas of a predetermined shape.

9. The method of claim 8 wherein each of the sample areas comprises one or more biological molecules.

10. The method of claim 8 wherein the array is a combinatorial array.

11. The method of claim 1 wherein the substrate is gold and the patterning compound is a protein or peptide or has the formula $R_1SH$, $R_1SSR_2$, $R_1SR_2$, $R_1SO_2H$, $(R_1)_3P$, $R_1NC$, $R_1CN,(R_1)_3N$, $R_1COOH$, or ArSH, wherein:
$R_1$ and $R_2$ each has the formula $X-(CH_2)_n-$ and, if a compound is substituted with both $R_1$ and $R_2$, then $R_1$ and $R_2$ can be the same or diffferent;
n is 0-30;
Ar is an aryl;
X is $-CH_3$, $-CHCH_3$, $-COOH$, $-CO_2(CH_2)_mCH_3$, $-OH$, $-CH_2OH$, ethylene glycol, hexa(ethylene glycol), —O(CH$_2$)$_m$CH$_3$, —NH$_2$, —NH(CH$_2$)$_m$NH$_2$, halogen, glucose, maltose, fullerene C60, a nucleic acid, a protein, or a ligand; and m is 0-30.

12. The method of claim 11 wherein the patterning compound has the formula R$_1$SH or ArSH.

13. The method of claim 12 wherein the patterning compound has the formula R$_1$SH and X is a nucleic acid.

14. The method of claim 1 wherein the substrate is gold and the resist comprises a compound having the formula R$_1$SH, R$_1$SSR$_2$, R$_1$SR$_2$, R$_1$SO$_2$H, (R$_1$)$_3$P, R$_1$NC, R$_1$CN, (R$_1$)$_3$N, R$_1$COOH, or ArSH, wherein:

R$_1$ and R$_2$ each has the formula X(CH$_2$)$_n$ and, if a compound is substituted with both R$_1$ and R$_2$, then R$_1$ and R$_2$ can be the same or different;

n is 0-30;

Ar is an aryl;

X is —CH$_3$, —CHCH$_3$, —COOH, —CO$_2$(CH$_2$)$_m$CH$_3$, —OH, —CH$_2$OH, ethylene glycol, hexa(ethylene glycol), —O(CH$_2$)$_m$CH$_3$, —NH$_2$, —NH(CH$_2$)$_m$NH$_2$, halogen, glucose, maltose, fullerene C60, a nucleotide, an oligonucleotide, a nucleic acid, a protein, or a ligand; and m is 0-30.

15. The method of claim 14 wherein the resist comprises a compound having the formula R$_1$SH wherein n is 5-15.

16. The method of claim 15 wherein X is a nucleotide or an oligonucleotide.

17. The method of claim 15 wherein the resist comprises a plurality of compounds, wherein X of one of the compounds is a nucleotide or an oligonucleotide and X of another of the compounds is —CH$_3$, —COOH, —OH or —CH$_2$OH.

18. The method of claim 1 wherein a mechanical force is used to apply the tip to the substrate.

19. The method of claim 1 wherein the tip is applied to the substrate using a force that is generated by an electrical field.

20. The method of claim 1 wherein the tip is applied to the substrate using a force that is generated by a magnetic field.

21. The method of claim 1 wherein the tip is an atomic force microscope tip.

22. A method of forming a three-dimensional structure on a substrate comprising:

(a) applying a foundation layer to a substrate by
providing a tip with a drop of patterning compound on a surface of the tip;
applying the tip to a portion of the substrate coated with a resist wherein a high normal force is formed between the tip and the substrate by the surface tension of the drop of patterning compound on the tip that forms high normal force between the tip and substrate; and,
moving the tip to remove resist from the substrate, whereupon the patterning compound attaches to the substrate from which the resist has been removed by the tip to form a pattern of the patterning compound on the substrate wherein the patterning compound comprises a nucleic acid;

(b) providing a structure-forming compound comprising a nucleic acid having a sequence complementary to the sequence of at least a portion of the nucleic acid of the patterning compound;

(c) applying the structure-forming compound to the foundation layer; and (d) repeating steps (b) and (c) to form the desired three-dimensional structure, wherein the three-dimensional structure is formed at least in part by the hybridization of the nucleic acids of the structure-forming compound and the patterning compound.

23. The method of claim 22 further comprising removing all of the resist from the substrate.

24. The method of claim 22 wherein:

each of the patterning compounds comprises a nucleic acid and each of the structure-forming compounds comprises a nucleic acid having a sequence complementary to the sequence of at least a portion of the nucleic acid of one of the patterning compounds; and the three-dimensional structure is formed by the hybridization of the nucleic acids of the structure-forming compounds and the patterning compounds.

25. The method of claim 24 wherein at least one of the structure-forming compounds comprises oligonucleotides attached to nanoparticles.

26. The method of claim 24 wherein the resist comprises:

a compound having the formula X—(CH$_2$)$_n$—SH, wherein:

n is at least 1; and

X is a nucleotide or an oligonucleotide comprising at least 2 nucleotides.

27. The method of claim 26 wherein n is 1-30.

28. The method of claim 27 wherein n is 5-15.

29. The method of claim 26 wherein X is an oligonucleotide comprising at least 10 nucleotides.

* * * * *